United States Patent
Kohya

(10) Patent No.: US 6,521,843 B1
(45) Date of Patent: *Feb. 18, 2003

(54) MULTILAYER PRINTED CIRCUIT BOARD HAVING SIGNAL, POWER AND GROUND THROUGH HOLES

(75) Inventor: Kenji Kohya, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/304,631

(22) Filed: May 4, 1999

(30) Foreign Application Priority Data

May 13, 1998 (JP) .......................... 10-130372

(51) Int. Cl.[7] ................................. H05K 1/03
(52) U.S. Cl. .................. 174/255; 174/266; 361/794; 361/795
(58) Field of Search ................. 174/255, 262–265, 174/266; 361/792–795

(56) References Cited

U.S. PATENT DOCUMENTS

| | | | |
|---|---|---|---|
| 4,849,284 A | * | 7/1989 | Arthur et al. ............... 428/325 |
| 5,191,174 A | * | 3/1993 | Chang et al. ............... 174/266 |
| 5,293,502 A | * | 3/1994 | Kimura et al. .............. 174/250 |
| 5,714,718 A | * | 2/1998 | Tanaka ....................... 174/255 |
| 5,719,750 A | | 2/1998 | Iwane |
| 5,774,340 A | * | 6/1998 | Chang et al. ............... 361/771 |
| 5,838,549 A | * | 11/1998 | Nagata et al. ............. 174/35 R |
| 5,856,636 A | * | 1/1999 | Sanso ......................... 174/255 |
| 6,006,428 A | * | 12/1999 | Feilchenfeld et al. ......... 29/852 |
| 6,184,477 B1 | * | 2/2001 | Tanahashi ................... 174/261 |
| 6,191,475 B1 | * | 2/2001 | Skinner et al. ............. 174/255 |
| 6,229,095 B1 | * | 5/2001 | Kobayashi .................. 174/255 |
| 6,256,850 B1 | * | 7/2001 | Lauffer et al. ............. 29/25.42 |
| 6,329,604 B1 | * | 12/2001 | Koya ......................... 174/255 |

FOREIGN PATENT DOCUMENTS

| | | |
|---|---|---|
| JP | 7-131159 | 5/1995 |
| JP | 7-235775 | 9/1995 |
| JP | 9-321433 | 12/1997 |

* cited by examiner

*Primary Examiner*—Albert W. Paladini
*Assistant Examiner*—José H. Alcalá
(74) *Attorney, Agent, or Firm*—Foley & Lardner

(57) ABSTRACT

A multilayer printed circuit board enables needless electro-magnetic radiation to be suppressed. Interlayer insulation materials are arranged in layer-built constitution between respective layers of a mixed wiring layer of a first signal and/or a power supply wiring, a first ground layer, a second ground layer, and a mixed wiring layer of a second signal and/or a power supply wiring. A through-hole for connecting the ground layers with each other is provided adjacently to a through-hole for connecting the signal and/or the power supply between these layers. According to the constitution, a return circuit current route of the signal and the power supply to the ground layers is secured. As a result, a loop made by the current becomes small, thus needless radiation of electro-magnetic wave is capable of being suppressed.

3 Claims, 9 Drawing Sheets

MULTILAYER PRINTED CIRCUIT BOARD HAVING SIGNAL, POWER AND GROUND THROUGH HOLES

BACKGROUND OF THE INVENTION

The present invention relates to a multilayer printed circuit board. More to particularly, this invention relates to a multilayer printed circuit board which enables needless radiation of electromagnetic wave to be suppressed for preventing electromagnetic interference.

DESCRIPTION OF THE PRIOR ART

Structural example of conventional multilayer printed circuit board is shown in FIGS. 1, 2, 3, and 4.

FIG. 1 is a sectional view showing one example of 4-layer printed circuit board by way of conventional example 1. In FIG. 1, the 4-layer printed circuit board is provided with a first signal wiring layer 111, a ground layer 112, a power supply layer 113, and a second signal wiring layer 114 in order from above. Interlayer insulation materials 115 to 117 are formed between these wiring layers 111 to 114. Further, a signal wiring 118 is arranged in the first signal wiring layer 111, a signal wiring 119 is arranged in the second signal wiring layer 114, a ground wiring 120 is arranged in the ground layer 112, and a power supply wiring 121 is arranged in the power supply layer 113.

In FIG. 1, if signal current flows through the signal wiring 118, return circuit current is induced in the ground wiring 120 of the adjacent ground layer 112 through the interlayer insulation material 115. A loop which is made by the signal wiring 118 and the ground wiring 120 is small, thus needless electromagnetic wave radiated from the loop is small.

FIG. 2 is a sectional view showing one example of conventional 6-layer printed circuit board by way of conventional example 2. The 6-layer printed circuit board is provided with a first signal wiring layer 131, a second signal wiring layer 132, a ground layer 133, a power supply layer 134, a third signal wiring layer 135, and a fourth signal wiring layer 136 in order from above. Interlayer insulation materials 137, 138, 139, 140, 141 are formed between these wiring layers 131 to 136. Further, a signal wiring 142 is arranged in the first signal wiring layer 131, a signal wiring 143 is arranged in the second signal wiring layer 132, a signal wiring 144 is arranged in the third signal wiring layer 135, a signal wiring 145 is arranged in the fourth signal wiring layer 136, a ground wiring 146 is arranged in the ground layer 133, and a power supply wiring 147 is arranged in the power supply layer 134.

In FIG. 2, if signal current flows through the signal wiring 143, a return circuit current is induced in the ground wiring 146 of the adjacent ground layer 133 through the interlayer insulation material 138. A loop which is made by the signal wiring 143 and the ground wiring 146 is small, thus needless electro-magnetic wave radiated from the loop is small.

FIG. 3 is a sectional view showing another example of 6-layer printed circuit board of conventional example 3. The 6-layer printed circuit board is provided with a first signal wiring layer 151, a ground layer 152, a second signal wiring layer 153, a third signal wiring layer 154, a power supply layer 155, and a fourth signal wiring layer 156. Respective interlayer insulation materials 157, 158, 159, 160, and 161 are formed between these wiring layers 151 to 156. Further, a signal wiring 162 is arranged in the first signal wiring layer 151, a signal wiring 163 is arranged in the second signal wiring layer 153, a signal wiring 164 is arranged in the third signal wiring layer 154, a signal wiring 165 is arranged in the fourth signal wiring layer 156, a ground wiring 166 is arranged in the ground layer 152, and a power supply wiring 167 is arranged in the power supply layer 155.

In FIG. 3, if signal current flows through the signal wiring 162 or 163, a return circuit current is induced in the ground wiring 166 of the adjacent ground layer 152 through the interlayer insulation material 157 or 158. A loop which is made by the signal wiring 162 or 163 and the ground wiring 166 is small, thus needless electro-magnetic wave radiated from the loop is small.

FIG. 4 is a sectional view showing one example of 8-layer printed circuit board of conventional example 4. The 8-layer printed circuit board is provided with a first signal wiring layer 181, a second signal wiring layer 182, a ground layer 183, a third signal wiring layer 184, a fourth signal wiring layer 185, a power supply layer 186, a fifth signal wiring layer 187, and a sixth signal wiring layer 188 in order from above. Respective interlayer insulation materials 189, 190, 191, 192, 193, 194, and 195 are formed between these wiring layers 181 to 188. Further, a signal wiring 196 is arranged in the first signal wiring layer 181, a signal wiring 197 is arranged in the second signal wiring layer 182, a signal wiring 198 is arranged in the third signal wiring layer 184, a signal wiring 199 is arranged in the fourth signal wiring layer 185, a signal wiring 200 is arranged in the fifth signal wiring layer 187, a signal wiring 201 is arranged in the sixth signal wiring layer 188, a ground wiring 202 is arranged in the ground layer 183, and a power supply wiring 203 is arranged in the power supply layer 186.

In FIG. 4, if signal current flows through the signal wiring 197 or 198, a return circuit current is induced in the ground wiring 202 of the adjacent ground layer 183 through the interlayer 190 or 191. A loop which is made by the signal wiring 197 or 198 and the ground wiring 202 is small, thus needless electro-magnetic wave radiated from the loop is small.

However, above-described respective conventional examples include following problems.

If signal current flows through the signal wiring 119 shown in above conventional example 1, the return circuit current is not induced in the power supply wiring 121 of the adjacent power supply layer 113 through the interlayer insulation material 117, but the return circuit current is induced anywhere distant ground. For this reason, the loop which is made by the signal wiring 119 and anywhere distant ground to which the return circuit current is induced becomes large. Furthermore, in the same manner that~the signal wiring 111 is connected to the signal wiring 114 by a through hole 122, the return circuit current is induced anywhere distant ground, thus the loop which is made by successive signal wiring 111, through hole 122, and signal wiring 114 and anywhere distant ground becomes large, there is the problem that needless electro-magnetic wave radiated from the large loop becomes large.

If signal current flows through the signal wiring 142, the signal wiring 144, or the signal wiring 145 shown in the above conventional example 2, the return circuit current is not induced in the signal wiring 143 of the signal wiring layer 132 which is arranged adjacently through each interlayer insulation material 137, 140, or 141, further the return circuit current is not induced in the power supply 147 of the power supply layer 134, furthermore, the return circuit current is not induced the signal wiring 144 of the signal wiring layer 135, but the return circuit current is induced anywhere in the distant ground. For that reason, the loop which is made by the signal wiring 142, 144, or 145 and anywhere distant ground to which the return circuit current is induced becomes large. In the same manner when at least more than two of the signal wiring 142, 143, 144, and 145 are connected by the through hole 148, the return circuit current is induced anywhere in the distant ground. The loop which is made by at least more than two of the successive signal wiring 142, 143, 144, and 145 and the through hole 148, and anywhere distant ground becomes large, thus there is the problem that needless electro-magnetic wave radiated from these loops becomes large.

If signal current flows through the signal wiring 164, or the signal wiring 165 shown in the above conventional example 3, the return circuit current is not induced in the power supply wiring 167 of the power supply layer which is arranged adjacently through each interlayer insulation material 160, or 161, but the return circuit current is induced anywhere in the distant ground. For that reason, the loop which is made by the signal wiring 164, or 145 and anywhere distant ground to which the return circuit current is induced becomes large. In the same manner when at least one of the signal wiring 164, and 165 is included, and a signal wiring of different signal layer is connected by the through hole 168, the return circuit current is induced anywhere in the distant ground. The loop which is made by the signal wiring including at least more than one of the signal wiring 164, and 165 and the through hole, and anywhere distant ground becomes large, thus there is the problem that needless electro-magnetic wave radiated from these loops becomes large.

If signal current flows through the signal wiring 196, 199, 200, or 201 shown in the above conventional example 4, the return circuit current is not induced in the signal wiring 197, power supply wiring 203, and the signal wiring 200 which are arranged adjacently through each interlayer insulation material 189, 193, 194, or 195, but the return circuit current is induced anywhere in the distant ground. For that reason, the loop which is made by the signal wiring 196, 199, 200, or 201 and anywhere distant ground to which the return circuit current is induced becomes large. In the same manner when at least more than one of the signal wiring 196, 199, 200, or 201 is included, and a signal wiring of different signal layer is connected by the through hole 204, the return circuit current is induced anywhere in the distant ground. The loop which is made by the successive signal wiring including at least more than one of the signal wiring 196, 199, 200, or 201 and the through hole 204, and anywhere distant ground becomes large, thus there is the problem that needless electro-magnetic wave radiated from these loops becomes large.

SUMMARY OF THE INVENTION

In view of the foregoing, it is an object of the present invention, in order to overcome the above-mentioned problems, to provide a multilayer printed circuit board which can suppress needless electro-magnetic radiation.

According to a first aspect of the present invention, in order to achieve the above-mentioned object, there is provided a multilayer printed circuit board which comprises at least two wiring layers in which a signal wiring and/or a power supply wiring for constituting an advance circuit current route of a signal and/or a power supply is mixed, and at least two ground layers in which at least one of them is arranged adjacently to the respective all-two wiring layers, wherein a return circuit current route of the signal and/or the power supply toward the ground layer is secured.

According to a second aspect of the present invention, there is provided a multilayer printed circuit board, in the first aspect, wherein the multilayer printed circuit board comprises a signal and/or a power supply through-hole for connecting interlayer of the signal wiring and/or the power supply wiring in at least two wiring layers continuously, and a through-hole for connecting at least two of the ground layers each other existing adjacently to the signal and/or the power supply through-hole, thus continuous return circuit current route is secured with respect to the advance circuit current route of the at least two wiring layers.

According to a third aspect of the present invention, in the first or the second aspect, there is provided a multilayer printed circuit board, wherein the multilayer printed circuit board is provided with an interlayer insulation material for ensuring insulation for each wiring between at least two ground layers in at least two wiring layers.

According to a fourth aspect of the present invention, in any of the first to the third aspect, there is provided a multilayer printed circuit board, the multilayer printed circuit board has a relationship of position between at least two wiring layers and at least two ground layers that at least four-layer of layer-built constitution is made by a mixed wiring layer of a first signal and/or a power supply wiring, a first ground layer, a second ground layer, and a mixed wiring layer of a second signal and/or a power supply wiring in order of above layer-built constitution.

According to a fifth aspect of the present invention, in any of the first to third aspect, there is provided a multilayer printed circuit board, the multilayer printed circuit board has a relationship of position between at least two wiring layers and at least two ground layers that at least four-layer of layer-built constitution is made by a mixed wiring layer of a first signal and/or a power supply wiring, a first ground layer, a mixed wiring layer of a second signal and/or a power supply wiring, and a second ground layer, in order of above layer-built constitution.

According to a sixth aspect of the present invention, in any of the first to the third aspect, there is provided a multilayer printed circuit board, the multilayer printed circuit board has a relationship of position between at least two wiring layers and at least two ground layers that at least six-layer of layer-built constitution is made by a mixed wiring layer of a first signal and/or a power supply wiring, a first ground layer, a mixed wiring layer of a second signal and/or a power supply wiring, a mixed wiring layer of a third signal and/or a power supply wiring, a second ground layer, and a mixed wiring layer of a fourth signal and/or a power supply wiring in order of above layer-built constitution.

According to a seventh aspect of the present invention, in any of the first to the third aspect, there is provided a multilayer printed circuit board the multilayer printed circuit board has a relationship of position between at least two wiring layers and at least two ground layers that at least eight-layer of layer-built constitution is made by a mixed wiring layer of a first signal and/or a power supply wiring, a first ground layer, a mixed wiring layer of a second signal and/or a power supply wiring, a mixed wiring layer of a third signal and/or a power supply wiring, a second ground layer, a mixed wiring layer of a fourth signal and/or a power supply wiring, a third ground layer, and a mixed wiring layer of a fifth signal and/or a power supply wiring in order of above layer-built constitution.

The above and further objects and novel features of the invention will be more fully understood from the following detailed description when the same is read in connection

DETAILED DESCRIPTION OF THE PREFERRED EMBODIMENTS

A preferred embodiment of a multilayer printed circuit board according to the present invention will be described in detail in accordance with the accompanying drawings. FIGS. 5 to 20 show the embodiments of the multilayer printed circuit board of the present invention.

FIRST EMBODIMENT

Figure 1:
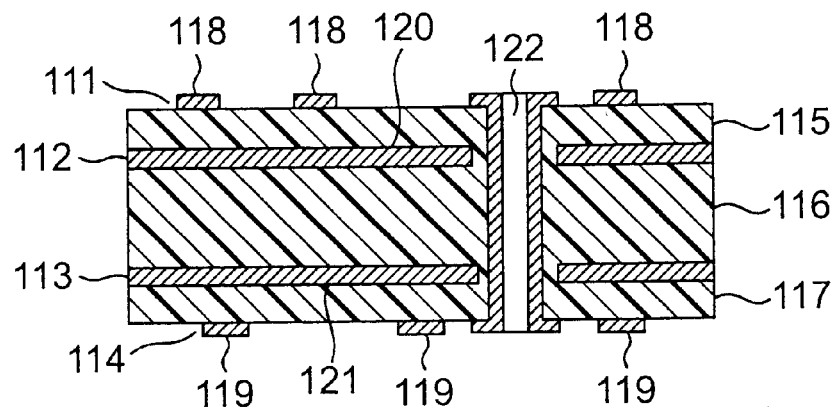
FIG. 1 is a sectional view showing one example of conventional 4-layer printed circuit board.
Figure 2:
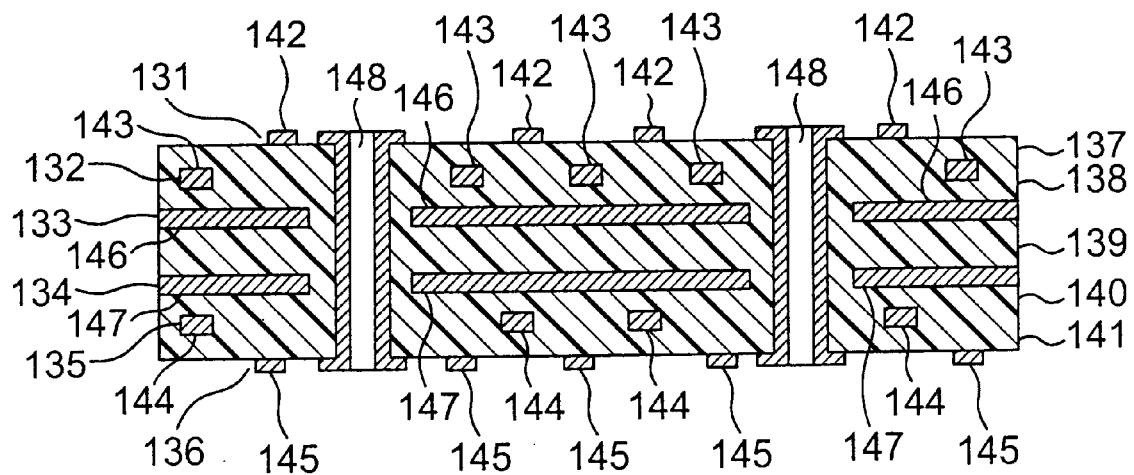
FIG. 2 is a sectional view showing one example of conventional 6-layer printed circuit board.
Figure 3:
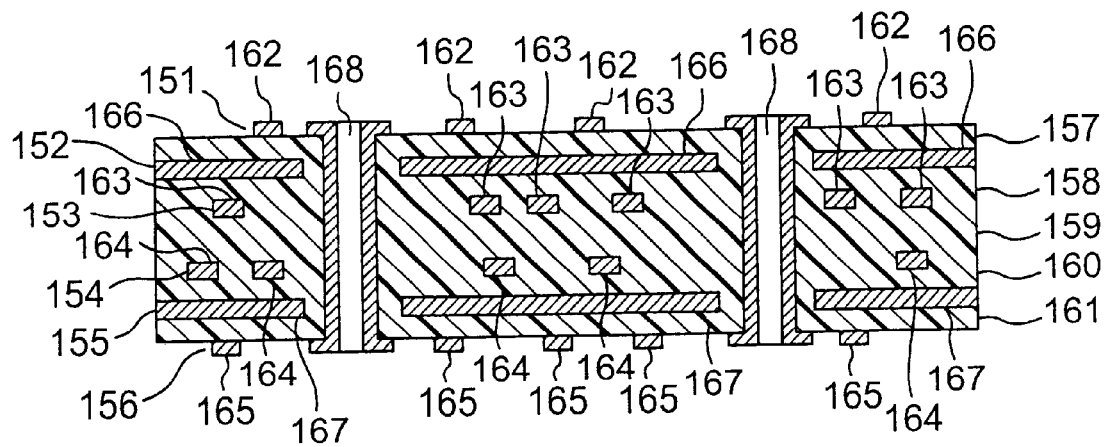
FIG. 3 is a sectional view showing another one example of conventional 6-layer printed circuit board.
Figure 4:
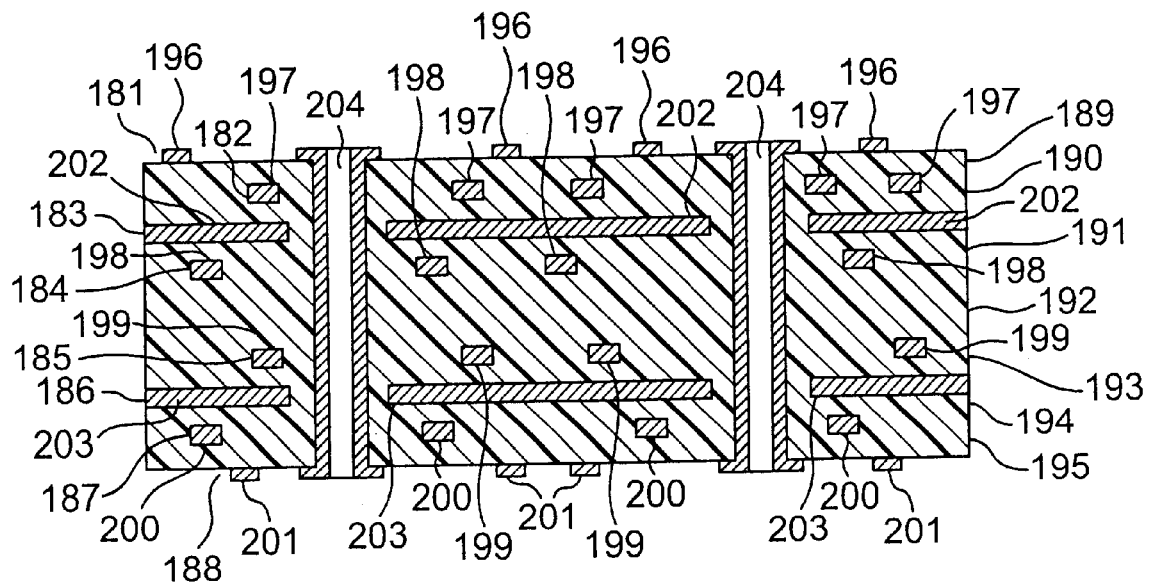
FIG. 4 is a sectional view showing one example of conventional 8-layer printed circuit board.
Figure 5:
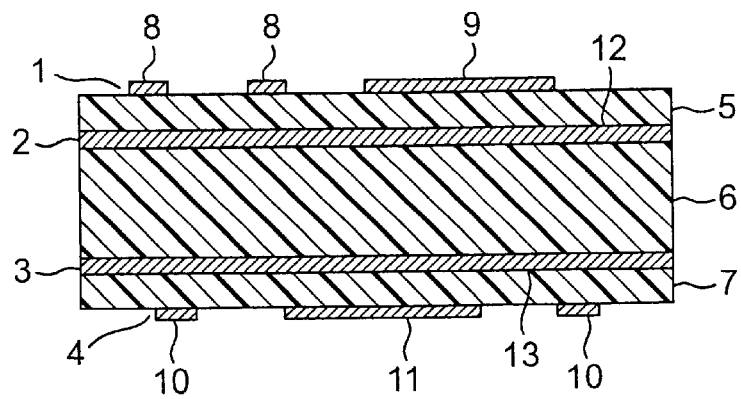
FIG. 5 is a sectional view showing 4-layer printed circuit board of an embodiment of multilayer printed circuit board according to the present invention.

FIG. 5 is a sectional view showing 4-layer printed circuit board according to one embodiment of the present invention. In FIG. 5, the 4-layer printed circuit board has a mixed wiring layer 1 including a first signal and/or power supply wiring, a first ground layer 2, a second ground layer 3, and a mixed wiring layer 4 including a second signal and/or power supply wiring in order from above. There are formed respective interlayer insulation materials 5, 6, and 7 between these wiring layers 1 to 4.

A signal wiring 8 and a power supply wiring 9 are mixed to be arranged in a mixed wiring layer 1 of a first signal and/or a power supply wiring respectively. A signal wiring 10 and a power supply wiring 11 are mixed to be arranged in a mixed wiring layer 4 of a second signal and/or power supply wiring respectively. A plane shaped ground wiring 12 is arranged in the first ground layer 2. A plane shaped ground wiring 13 is arranged in the second ground wiring layer 3.

In FIG. 5, the first ground layer 2 is arranged next to the mixed wiring layer 1 of the first signal and/or power supply wiring and spaced therefrom via the interlayer insulation material 5. The second ground layer 3 is arranged next to the mixed wiring layer 4 of the second signal and/or power supply wiring and spaced therefrom via the interlayer insulation material 7. For that reason, a return circuit current route of the signal wiring 8 and the power supply wiring 9 of the mixed wiring layer 1 of the first signal and/or the power supply wiring is made in the ground wiring 12 of the first ground layer 2. Similarly, a return circuit current route of the signal wiring 10 and the power supply wiring 11 of the mixed wiring layer 4 of the second signal and/or power supply wiring is made in the ground wiring 13 of the second ground layer 3. For that reason, a loop which is made by the signal current or power supply current and the respective return circuit current becomes small, thus it is capable of being suppressed needless electro-magnetic radiation.

Figure 6:
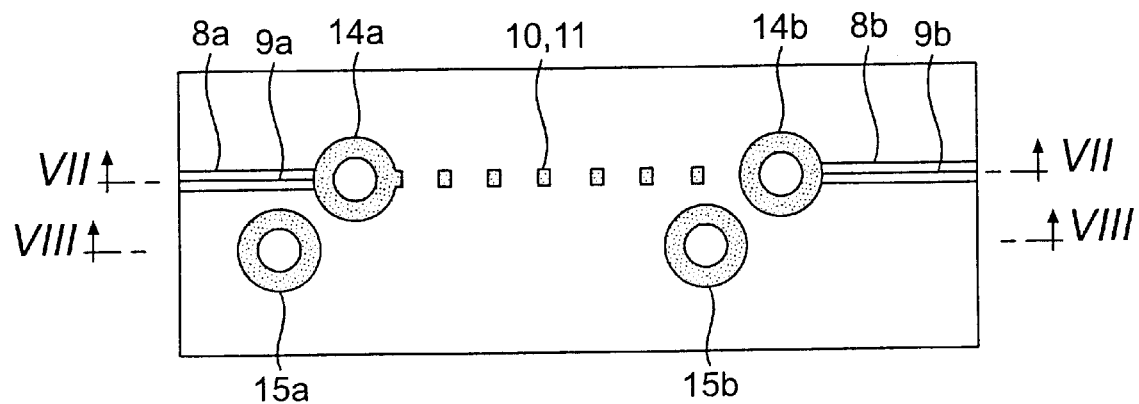
FIG. 6 is a plan view showing 4-layer printed circuit board.
Figure 7:
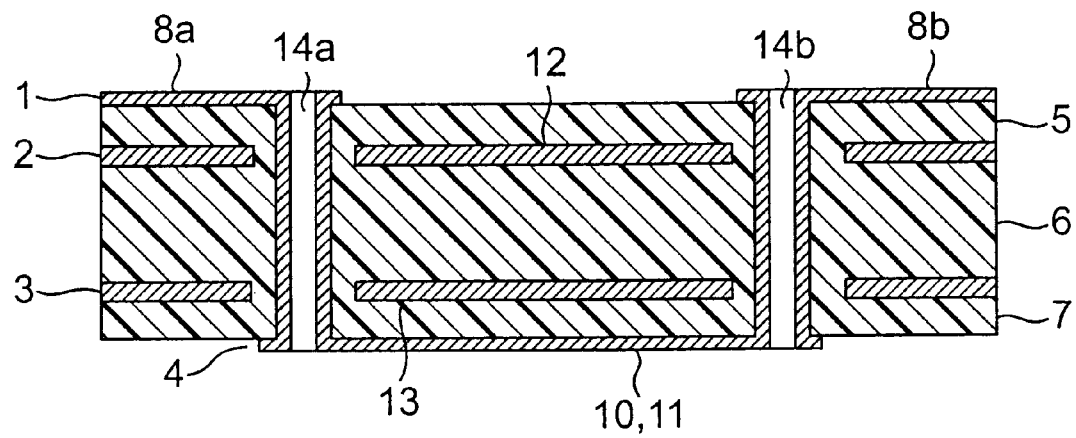
FIG. 7 is a sectional view along VII—VII of 4-layer printed circuit board of FIG. 6.
Figure 8:
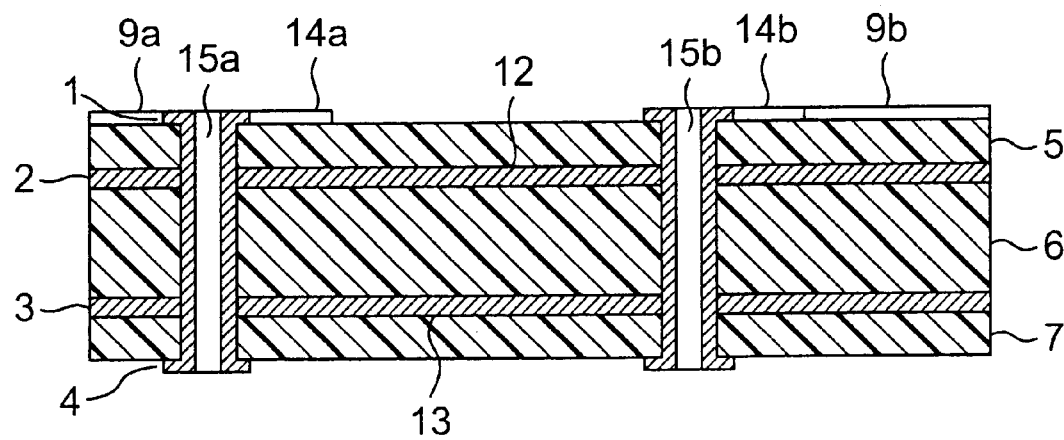
FIG. 8 is a sectional view along VIII—VIII of 4-layer printed circuit board of FIG. 6.

FIG. 6 is a plan view showing 4-layer printed circuit board according to one embodiment of the present invention. FIG. 7 is a sectional view along VII—VII of the 4-layer printed circuit board shown in FIG. 6. FIG. 8 is a sectional view along VIII—VIII of the 4-layer printed circuit board shown in FIG. 6. In these FIGS. 6, 7, and 8, the 4-layer printed circuit board has the mixed wiring layer 1 of the first signal and/or the power supply wiring, the first ground layer 2, the second ground layer 3, and the mixed wiring layer 4 of the second signal and/or the power supply wiring in order from above. Further, there are formed respective interlayer insulation material 5, 6, and 7, between these wiring layers 1 to 4.

Signal wiring 8a, 8b and power supply wiring 9a, 9b are mixed to be wired in the mixed wiring layer 1 of the first signal and/or the power supply wiring respectively. The signal wiring 10 and the power supply wiring 11 are mixed to be wired in the mixed wiring layer 4 of the second signal and/or the power supply wiring. The plane shaped ground wiring 12 is arranged in the first ground layer 2. The plane shaped ground wiring 13 is arranged in the second ground layer 3. Further, the signal wiring 8a or power supply wiring 9a a is connected to the signal and/or the power supply through hole 14a in the mixed wiring layer 1 of the first signal and/or the power supply wiring. The signal and/or the power supply through hole 14a is connected to the signal wiring 10 or the power supply wiring 11 in the mixed wiring layer 4 of the second signal and/or the power supply wiring. The signal wiring 10 or the power supply wiring 11 is connected to the signal and/or power supply through hole 14b. The signal and/or the power supply through hole 14b is connected to the signal wiring 8b or the power supply wiring 9b in the mixed wiring layer 1 of the first signal and/or the power supply wiring. Ground through holes 15a, 15b which connects the plane shaped ground wiring 12 of the first ground layer 2 with the plane shaped ground wiring 13 of the second ground layer 3 are arranged in a position adjacent to the signal and/or the power supply through holes 14a and 14b.

In FIGS. 6, 7, and 8, the signal wiring 8a or the power supply wiring 9a of the mixed wiring layer 1 of the first signal and/or the power supply wiring is connected to the signal wiring 10 or the power supply wiring 11 of the mixed wiring layer 4 of the second signal and/or power supply wiring in the signal and/or the power supply through hole 14a. Further, the signal wiring 10 or the power supply wiring 11 is connected to the signal wiring 8b or the power supply wiring 9b of the mixed wiring layer 1 of the first signal and/or the power supply wiring by the signal and/or power supply through hole 14b, thus forming current route. The ground through holes 15a and 15b which connects the ground wiring 12 of the first ground layer 2 with the ground wiring 13 of the second ground layer 3 are arranged in places adjacent to the signal and/or the power supply through holes 14a, 14b, thereby, continuous return circuit current route is made to the continuous current route in the mixed wiring layers 1, 4 of the first and the second signals and/or the power supply wiring. The loop which is made by the signal or the power supply current and return circuit current is not disconnected halfway, further which becomes small, thus it is capable of being suppressed needless electro-magnetic radiation.

Next, operation of the 4-layer printed circuit board according to the first embodiment shown in FIG. 5 will be described. If the current flows through advance circuit current route of the signal wiring 8 and the power supply wiring 9 of the mixed wiring layer 1 of the first signal and/or the power supply wiring, the return circuit current is induced in the adjacent ground wiring 12 of the first ground layer 2 arranged through the interlayer insulation material 5. The loop which is made by the signal wiring 8 and the power supply wiring 9 through which the signal or the power supply current flow caused by the induction, and the ground wiring 12 into which the return circuit current is induced becomes small in comparison with the case where the adjacent ground wiring 12 is not arranged in the mixed wiring layer 1 of the first signal and/or the power supply wiring. As a result, the needless electro-magnetic wave which is radiated from the loop is suppressed. Similarly, if the current flows through the signal wiring 10 and the power supply wiring 11 of the mixed wiring layer 4 of the second signal and/or power supply wiring, the return circuit current is induced in the adjacent ground wiring 13 of the second ground layer 3 arranged through the inter layer insulation material 7. The loop which is made by the signal wiring 10 and the power supply wiring 11 through which the signal or the power supply current flow caused by the induction, and the ground wiring 13 into which the return circuit current is induced becomes small in comparison with the case where the adjacent ground wiring 13 is not arranged in the mixed wiring layer 4 of the second signal and/or the power supply wiring. As a result, the needless electro-magnetic wave which is radiated from the loop is suppressed.

Operation of one embodiment of 4-layer printed circuit board shown in FIGS. 6, 7, and 8 will be described. The current continuously flows through the signal and/or the power supply through-hole 14a from the signal wiring 8a or the power supply wiring 9a of the mixed wiring layer 1 of the first signal and/or the power supply wiring, the signal wiring 10 or the power supply wiring 11 of the mixed wiring layer 4 of the second signal and/or power supply wiring, the signal and/or the power supply through hole 14b, and the signal wiring 8b or the power supply wiring 9b of the mixed wiring layer 1 of the first signal and/or the power supply wiring, thus the current flows through two layers continuously. Following this, the return circuit current is continuously induced in the adjacent ground wiring 12 of the first ground layer 2 arranged at respective signal or power supply wiring into which the current flows through the interlayer insulation materials 5, 6, or 7, the ground wiring 13 of the second ground layer 3, and the ground through-hole 15a and the ground through-hole 15b, thus the return circuit current is induced continuously. The signal or the power supply current flows from this induction through respective wiring 8a, 9a, 10, 11, 8b, and 9b the signal and/or the power supply through-holes 14a and 14b, and the induced return circuit current flows through the respective ground wirings 12 and 13, and the respective ground through-holes 15a and 15b, in which the loop is made by these wiring. The loop becomes small in comparison with the case where there is no the ground through-holes 15a and 15b adjacent to the signal and/or the power supply through-holes 14a, and 14b which connect respective signal and/or the power supply wiring of the first and the fourth mixed wiring layers of the signal and/or the power supply wiring. As a result thereof, the needless electro-magnetic wave radiated from the loop is suppressed.

A first effect in the embodiment described above is to enable the loop to be reduced in size, regarding the loop which is made by the current flowing through the whole power supply arranged in the printed circuit board and the signal wiring, and the return circuit current thereof. Consequently, radiation of the needless electro-magnetic wave is suppressed.

Furthermore, a second effect is to enable the loop to be reduced in size, regarding the loop which is made by the current continuously flowing through the power supply which exists more than two in different layer connected by the through-hole, and the return circuit current thereof. Consequently, the needless electro-magnetic wave is suppressed.

Moreover, a third effect is to be made the return circuit current route of the current flowing through the power supply and the signal wiring regardless of increase of number of the layer for the printed circuit board.

Figure 9:
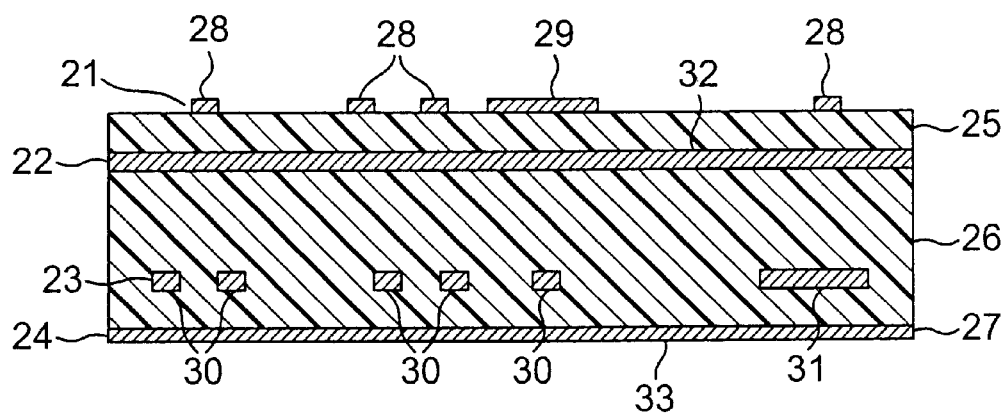
FIG. 9 is a view showing a second configuration example of 4-layer printed circuit board.

Next, a second embodiment of the present invention will be described in detail referring to the drawings. FIG. 9 is a configuration example of the second embodiment of the 4-layer printed circuit board. In FIG. 9, the 4-layer printed circuit board comprises a mixed wiring layer 21 of a first signal and/or a power supply wiring, a first ground layer 22, a mixed wiring layer 23 of a second signal and/or power supply wiring, and a second ground layer 24 in order from above, and there exists respective interlayer insulation materials 25, 26, and 27 between these wiring layers 21 to 24.

A signal wiring 28 and a power supply wiring 29 are arranged in a mixed wiring layer 21 of the first signal and/or the power supply wiring. A signal wiring 30 and a power supply wiring 31 are arranged in a mixed wiring layer 23 of a second signal and/or a power supply wiring. A plane shaped ground wiring 32 is arranged in a first ground layer 22. A plane shaped ground wiring 33 is arranged in a second ground layer 24. If the current flows through the signal wiring 28 or the power supply wiring 29, the return circuit current is induced in the adjacent ground wiring 32 of the first ground layer 22 arranged through the interlayer insulation material 25. A loop which is made by the signal wiring 28 or the power supply wiring 29 through which the signal or the power supply current flows from this induction, and the ground wiring 32 in which the return circuit current thereof is induced. The loop becomes small in comparison with the case where the ground wiring 32 is not arranged adjacently in the mixed wiring layer 21 of the first signal and/or the power supply wiring. With the result that the needless electro-magnetic wave radiated from the loop is suppressed.

Similarly, if the current flows through the signal wiring 30 and the power supply wiring 31 of the mixed wiring layer 23 of the second signal and/or the power supply wiring, the return circuit current is induced in the ground wiring 33 of the second ground layer 24 arranged adjacently through the interlayer insulation material 27. A loop which is made by the signal wiring 30 or the power supply wiring 31 through which the signal or the power supply current flows from the induction, and the ground wiring 33 in which the return circuit current is induced, becomes small in comparison with the case where the ground wiring 33 is not arranged adjacently in the mixed wiring layer 23 of the second signal and/or the power supply wiring. As a result thereof, the needless electro-magnetic wave radiated from the loop is suppressed.

Figure 12:
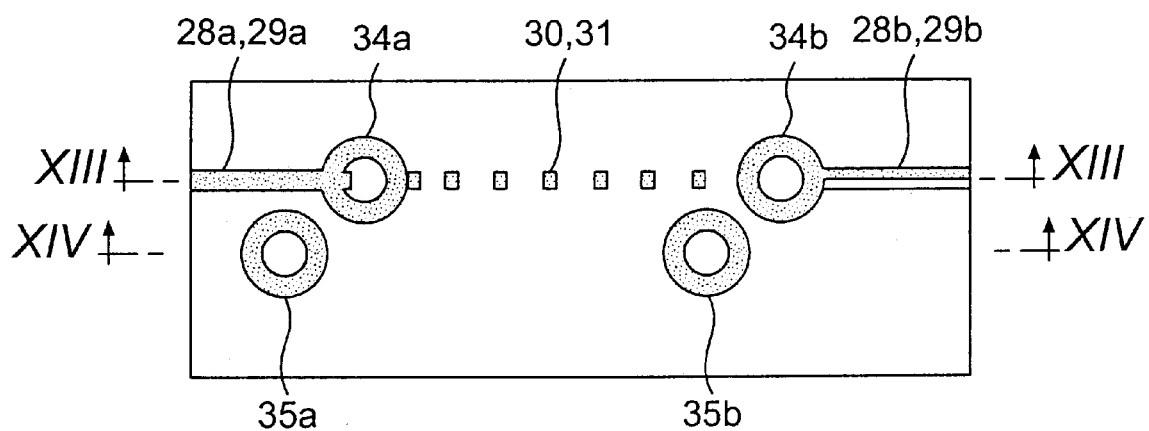
FIG. 12 is a plan view showing 4-layer printed circuit board according to the second embodiment of the present invention of FIG. 9.
Figure 13:
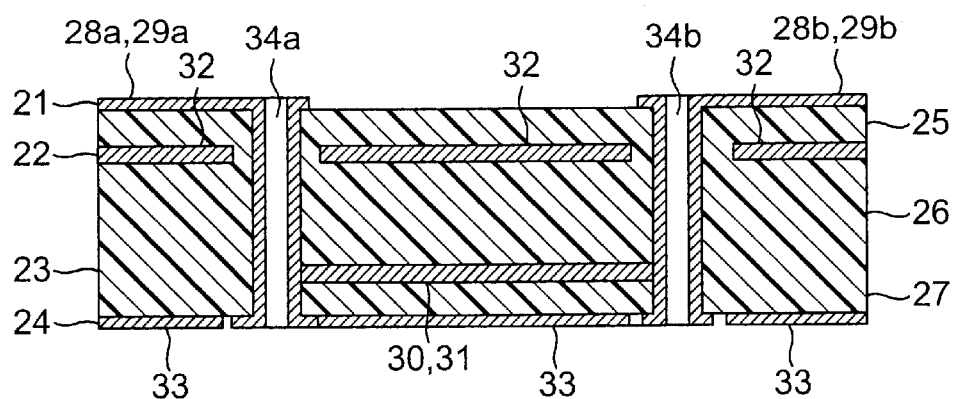
FIG. 13 is a sectional view along XIII—XIII of 4-layer printed circuit board of FIG. 12.
Figure 14:
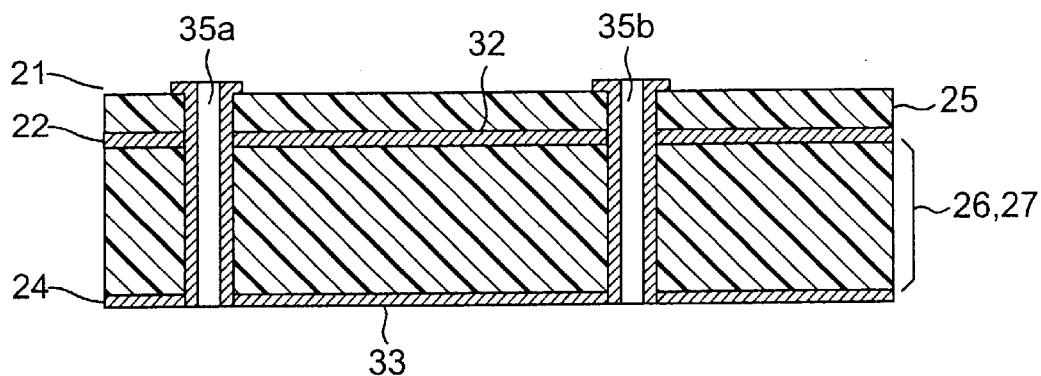
FIG. 14 is a sectional view along XIV—XIV of 4-layer printed circuit board of FIG. 12.

FIG. 12 is a plan view showing another embodiment of 4-layer printed circuit board as being enforcement of the present invention shown in FIG. 9. FIG. 13 is a sectional view along XIII—XIII of the embodiment of the 4-layer printed circuit board of FIG. 12. FIG. 14 is a sectional view along XIV—XIV of the embodiment of the 4-layer printed circuit board of FIG. 12. In these FIGS. 12, 13, and 14, the 4-layer printed circuit board comprises the mixed wiring layer 21 of the first signal and/or the power supply wiring, the first ground layer 22, the mixed wiring layer 23 of the signal and/or the power supply wiring, and the second ground layer 24 in order from above. There exists respective interlayer insulation materials 25 to 27 between these wiring layers 21 to 24.

The current continuously flows through the signal and/or the power supply through-hole 34a from the signal wiring 28a or the power supply wiring 29a of the mixed wiring layer 21 of the first signal and/or the power supply wiring, the signal wiring 30 or the power supply wiring 31 of the mixed wiring layer 23 of the second signal and/or power supply wiring, the signal and/or the power supply through hole 34b, and the signal wiring 28b or the power supply wiring, 29b of the mixed wiring layer 21 of the first signal and/or the power supply wiring, thus the current flows through two layers continuously. Following this, the return circuit current is continuously induced in the adjacent ground wiring 32 of the first ground layer 22, the adjacent ground wiring 33 of the second ground layer 24, the adjacent ground through-hole 35a, and the adjacent ground through-hole 35b arranged in respective signal or power supply wiring into which the current flows through the interlayer insulation materials 25, 26, or 27, thus the return circuit current is induced continuously.

The signal or the power supply current flows from this induction through respective wiring 28a, 29a, 30, 31, 28b, and 29b and the signal and/or the power supply through-holes 34a, and 34b, and the induced return circuit current flows through the respective ground wirings 32 and 33, and the respective ground through-holes 35a and 35b, in which the loop is made by these wiring. The loop becomes small in comparison with the case where there is no the ground through-holes 35a and 35b adjacent to the signal and/or the power supply through-holes 34a, and 34b which connect respective signal and/or the power supply wiring of the first and the fourth mixed wiring layers of the signal and/or the power supply wiring. As a result thereof, the needless electro-magnetic wave radiated from the loop is suppressed.

Figure 10:
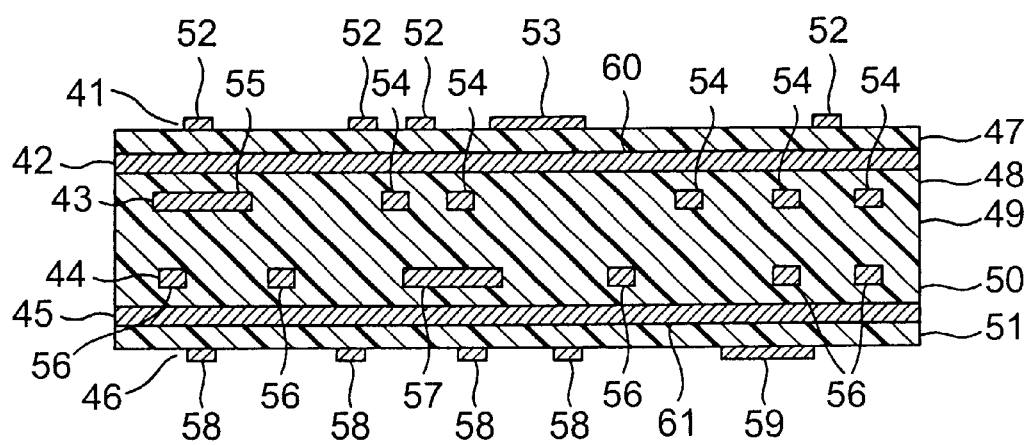
FIG. 10 is a sectional view showing 6-layer printed circuit board according to a second embodiment of the present invention.

FIG. 10 is a sectional view showing another enforcement configuration of 6-layer printed circuit board of the present invention.

In FIG. 10, the 6-layer printed circuit board comprises a mixed wiring layer 41 of a first signal and/or a power supply wiring, a first ground wiring layer 42, a mixed wiring layer 43 of a second signal and/or a power supply wiring, a mixed wiring layer 44 of a third signal and/or a power supply wiring, a second ground wiring layer 45, and a mixed wiring layer 46 of a fourth signal and/or a power supply wiring. There exists respective interlayer insulation materials 47 to 51 between these wiring layers 41 to 46 in order from above. A signal wiring 52 and a power supply wiring 53 are arranged in the mixed wiring layer 41 of the first signal and/or the power supply wiring. A signal wiring 54 and a power supply wiring 55 are arranged in the mixed wiring layer 43 of the second signal and/or the power supply wiring. A signal wiring 56 and a power supply wiring 57 are arranged in the mixed wiring layer 44 of the third signal and/or the power supply wiring. A signal wiring 58 and a power supply wiring 59 are arranged in the mixed wiring layer 46 of the fourth signal and/or the power supply wiring. A plane shaped ground wiring 60 is arranged in the first ground layer 42, and a plane shaped ground wiring 61 is arranged in the second ground layer 45.

It is desirable that power supply wiring is made more than at least two layers in the four mixed wiring layers 41, 43,44, and 46 of the signal and/or the power supply layers, and the signal wiring is made less than at most two layers.

The first ground wiring layer 42 is arranged adjacently both to the mixed wiring layer 41 of the first signal and/or the power supply wiring and the mixed wiring layer 43 of the second signal and/or the power supply wiring. Therefore, the ground wiring 60 becomes return circuit current route of the current flowing through signal wiring 52, and 54, and power supply wiring 53, and 55. Similarly, the second ground wiring layer 45 is arranged adjacently both to the mixed wiring layer 44 of the third signal and/or the power supply wiring and the mixed wiring layer 46 of the fourth signal and/or the power supply wiring. Therefore, the ground wiring 61 becomes a return circuit current route of the current flowing through signal wiring 56, and 58, and power supply wiring 57, and 59. For that reason, a loop of the current of the signal or the power supply which is made by the return circuit current route becomes small in comparison with the case where there is no ground wiring 60 or 61. As a result thereof, the needless radiation of electro-magnetic wave is suppressed.

Figure 15:
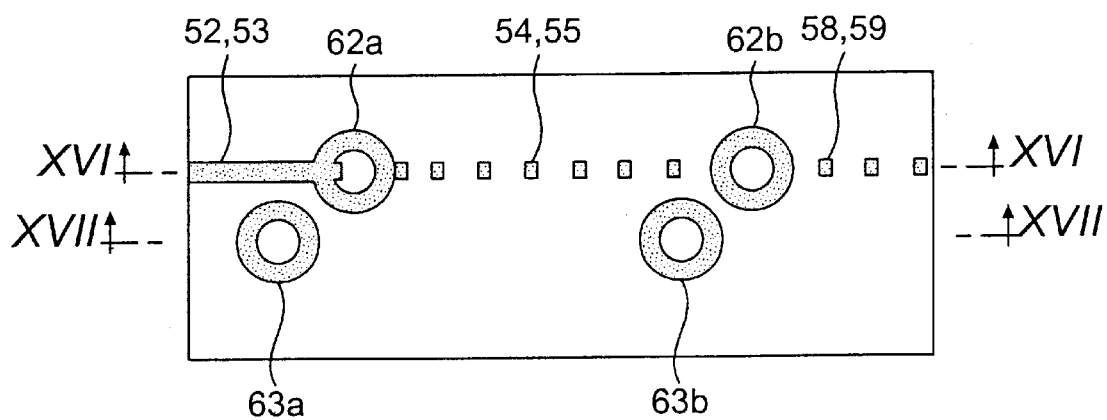
FIG. 15 is a plan view showing 6-layer printed circuit board of FIG.
Figure 16:
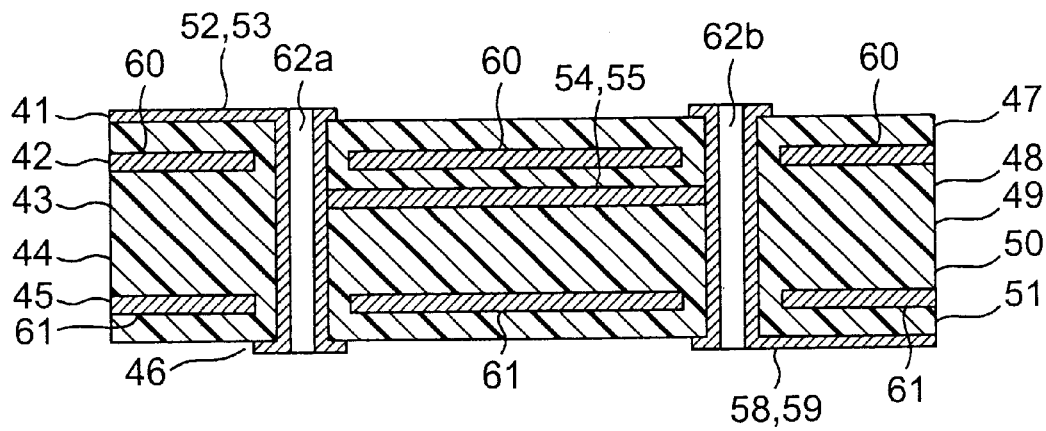
FIG. 16 is a sectional view along XVI—XVI of 6-layer printed circuit board of FIG. 15.
Figure 17:
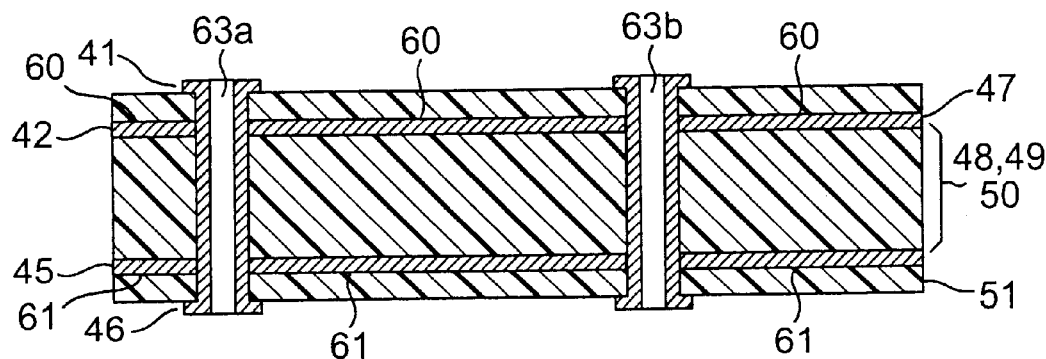
FIG. 17 is a sectional view along XVIII—XVIII of 6-layer printed circuit board of FIG. 15.

FIG. 15 is a plan view showing an embodiment of the 6-layer printed circuit board shown in FIG. 10. FIG. 16 is a sectional view along XVI—XVI of the embodiment of the 6-layer printed circuit board of FIG. 15. FIG. 17 is a sectional view along XVII—XVII of the embodiment of the 6-layer printed circuit board of FIG. 15.

In these FIGS. 15, 16, and 17, the 6-layer printed circuit board comprises the mixed wiring layer 41 of the first signal and/or the power supply wiring, the first ground layer 42, the mixed wiring layer 43 of the second signal and/or the power supply wiring, the mixed wiring layer 44 of the third signal and/or the power supply wiring, the second ground layer 45, and the mixed wiring layer 46 of the fourth signal and/or the power supply wiring. There exists respective interlayer insulation materials 47 to 51 between these wiring layers 41 to 46.

Further, the 6-layer printed circuit board comprises a signal wiring 52 or a power supply wiring 53 of the mixed wiring layer 41 of the first signal and/or the power supply wiring, a signal wiring 54 or a power supply wiring 55 of the mixed wiring layer 43 of the second signal and/or the power supply wiring, a signal and/or a power supply through-hole 62a which is connected both to the signal wiring 52 or the power supply wiring 53 and the signal wiring 54 or the power supply wiring 55, a signal wiring or a power supply wiring (not illustrated) of the mixed wiring layer 44 of the third signal and/or the power supply wiring, a signal wiring 58 or a~power supply wiring 59 of the mixed wiring layer 46 of the fourth signal and/or the power supply wiring, a signal and/or a power supply through-hole 62b which is connected both to the signal wiring 54 or the power supply wiring 55 and the signal wiring 58 or the power supply 59. The 6-layer printed circuit board is provided with the ground through-hole 63a adjacent to the signal and/or the power supply through-hole 62a, and the ground through-hole 63b adjacent to the signal and/or the power supply through-hole 62b so that the ground wiring 60 is connected to the ground wiring 61 respectively.

The current flows to the signal and/or the power supply through- hole 62a from the signal wiring 52 or the power supply wiring 53, to the signal wiring 54 or the power supply wiring 55, to the signal and/or the power supply through-hole 62b, and to the signal wiring 58 or the power supply wiring 59. Then, the return circuit current is induced in the ground wiring 60 with respect to the signal wiring 52 or the power supply wiring 53. The return circuit current is induced in the ground through-hole 63a with respect to the signal and/or the power supply through-hole 62a. The return circuit current is induced in the ground wiring 60 with respect to the signal wiring 54 or the power supply wiring 55. The return circuit current is induced in the ground through-hole 63b with respect to the signal and/or the power supply through-hole 62b. The return circuit current is induced in the ground wiring 61 with respect to the signal wiring 58 or the power supply wiring 59. Thus the return circuit current route is also secured continuously. With the result that the loop made by the current becomes small, thus radiation of needless electro-magnetic wave is suppressed.

Figure 11:
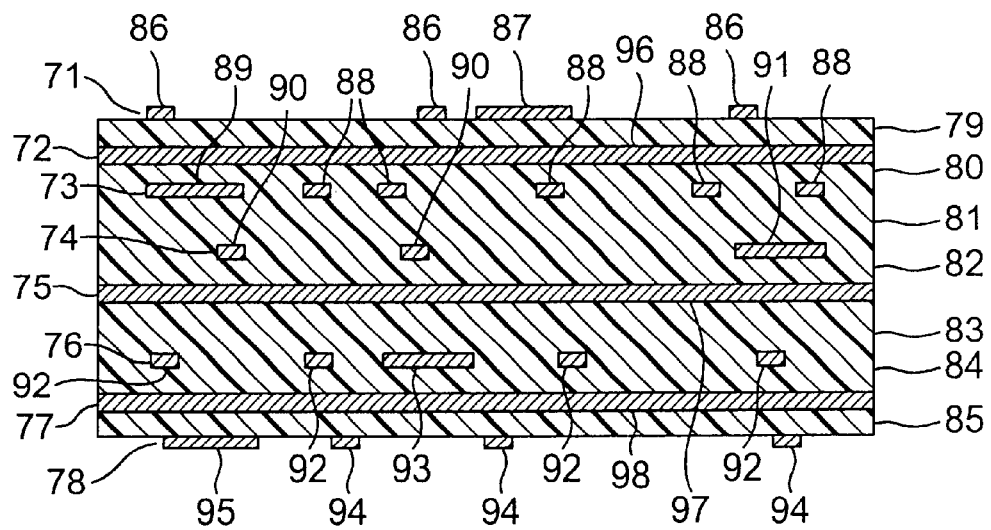
FIG. 11 is a sectional view showing 8-layer printed circuit board according to a second embodiment of the present invention.

FIG. 11 is a sectional view of 8-layer printed circuit board which is another embodiment of the present invention.

In FIG. 11, the 8-layer printed circuit board comprises a mixed wiring layer 71 of a first signal and/or a power supply wiring, a first ground layer 72, a mixed wiring layer 73 of a second signal and/or a power supply wiring, a mixed wiring layer 74 of a third signal and/or a power supply wiring, a second ground layer 75, a mixed wiring layer 76 of a fourth signal and/or a power supply wiring, a third ground layer 77, and a mixed wiring layer 78 of a fifth signal and/or a power supply wiring in order from above. There exists respective interlayer insulation materials 79 to 85 between these wiring layers 71 to 78.

A signal wiring 86 and a power supply wiring 87 are arranged in the mixed layer 71 of the first signal and/or the power supply wiring. A signal wiring 88 and a power supply wiring 89 are arranged in the mixed wiring layer 73 of the second signal and/or the power supply wiring. A signal wiring 90 and a power supply wiring 91 are arranged in the mixed wiring layer 74 of the third signal and/or the power supply wiring. A signal wiring 92 and a power supply wiring 93 are arranged in the mixed wiring layer 76 of the fourth signal and/or the power supply wiring. A signal wiring 94 and a power supply wiring 95 are arranged in the mixed wiring layer 78 of the fifth signal and/or the power supply wiring. A plane shaped ground wiring 96 is arranged in the first ground layer 72. A plane shaped ground wiring 97 is arranged in the second ground layer 75. A plane shaped ground wiring 98 is arranged in the third ground layer 77. It is desirable that the power supply wiring is wired at least more than two layers in the mixed wiring layers 71, 73, 74, 76, 78 of five signals and/or the power supply wiring, and that only the signal wiring is wired at most less than three layers.

The first ground layer 72 is arranged adjacently both to the mixed wiring layer 71 of the first signal and/or the power supply wiring and the mixed wiring layer 73 of the second signal and/or the power supply wiring, thus the ground wiring 96 becomes the return circuit current route of the current flowing through the signal wiring 86 and the signal wiring 88 and the power supply wiring 87 and the power supply wiring 89. The second ground layer 75 is arranged adjacently to the mixed layer 74 of the third signal and/or the power supply wiring, thus the ground wiring 97 becomes the return circuit current route of the current flowing through the signal wiring 90 and the power supply wiring 91. Further, the third ground layer 77 is arranged adjacently both to the mixed layer 76 of the fourth signal and/or the power supply wiring and the mixed wiring layer 78 of the fifth signal and/or the power supply wiring, thus the plane shaped ground wiring 98 becomes the return circuit current route of the current flowing through the signal wiring 92 and the signal wiring 94 and the power supply wiring 93 and the power supply wiring 95. The loop which is made by these routes becomes small in comparison with the case where there is no the ground wiring 96, 97, or 98. As a result, radiation of needless electro-magnetic wave is suppressed.

Figure 18:
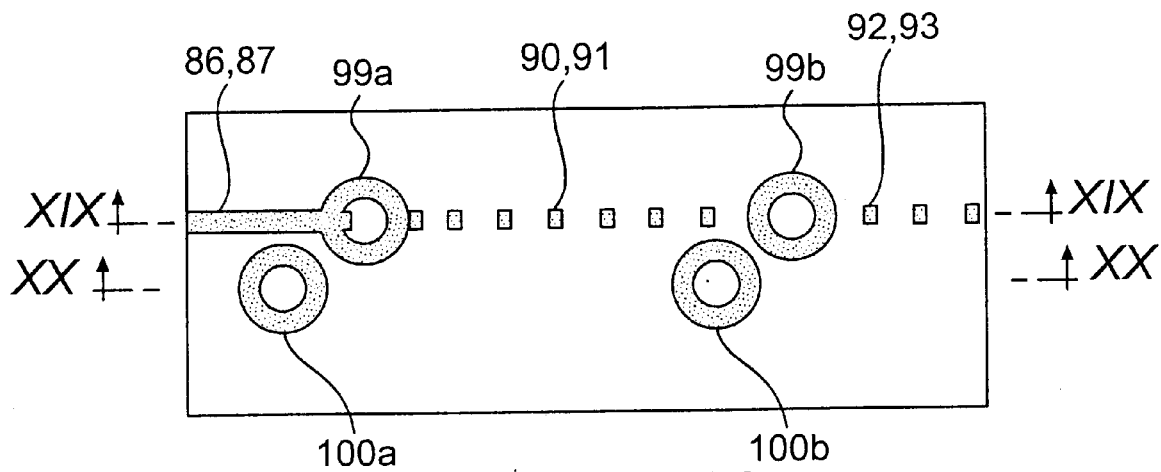
FIG. 18 is a plan view showing 8-layer printed circuit board of FIG. 11.
Figure 19:
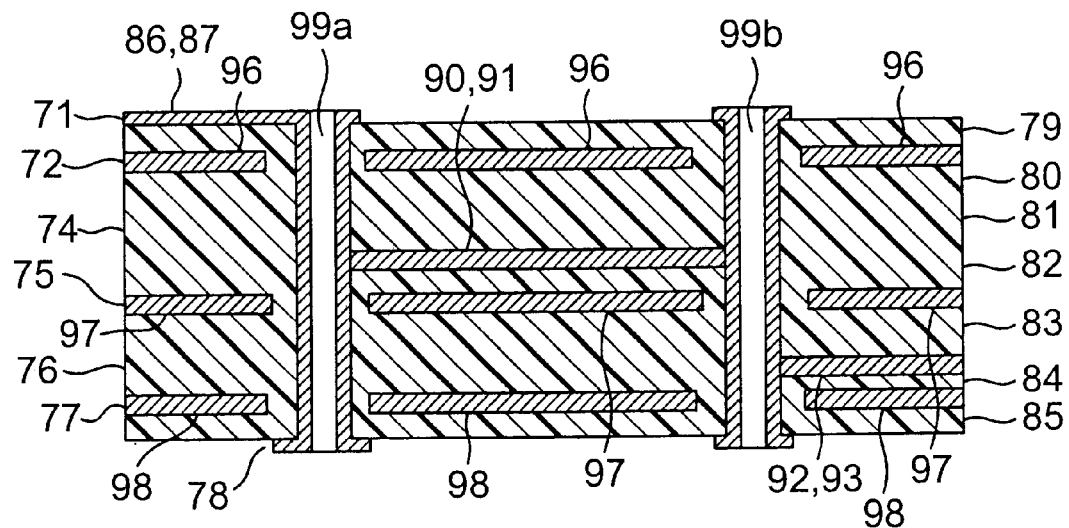
FIG. 19 is a sectional view along XIX—XIX of 8-layer printed circuit board of FIG. 18.
Figure 20:
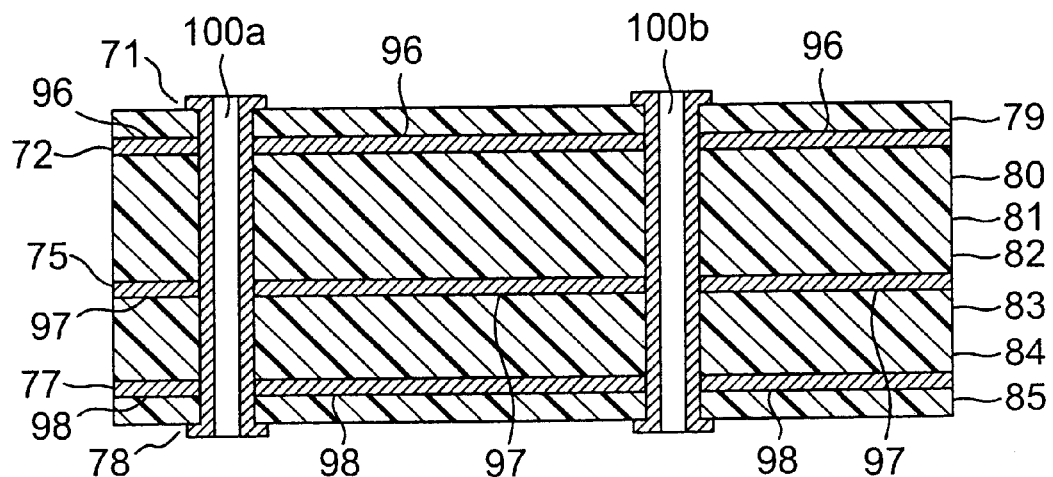
FIG. 20 is a sectional view along XX—XX of 8-layer printed circuit board of FIG. 18.

FIG. 18 is a plan view of an embodiment of 8-layer printed circuit board of FIG. 11. FIG. 19 is a sectional view along XIX—XIX of the embodiment of the 8-layer printed circuit board of FIG. 18. FIG. 20 is a sectional view along X—X of the embodiment of the 8-layer printed circuit board of FIG. 18.

In FIGS. 18, 19, and 20, the 8-layer printed circuit board comprises a mixed wiring layer 71 of a first signal and/or a power supply wiring, a first ground layer 72, a mixed wiring layer 73 of a second signal and/or a power supply wiring, a mixed wiring layer 74 of a third signal and/or a power supply wiring, a second ground layer 75, a mixed wiring layer 76 of a fourth signal and/or a power supply wiring, a third ground layer 77, and a mixed wiring layer 78 of a fifth signal and/or a power supply wiring in order from above. There exists respective interlayer insulation materials 79 to 85 between these wiring layers 71 to 78.

Furthermore, the 8-layer printed circuit board comprises a signal wiring 86 or a power supply wiring 87 of the mixed wiring layer 71 of the first signal and/or the power supply wiring, a signal and/or a power supply through-hole 99a connected to the signal wiring 90 or the power supply wiring 91 of the mixed layer 74 of the third signal and/or the power supply wiring, and a signal and/or a power supply through-hole 99b connected both to the signal wiring 90 or the power supply wiring 91 of the mixed layer 74 of the third signal and/or the power supply wiring and the signal wiring 92 and the power supply wiring 93 of the mixed wiring layer 76 of the fourth signal and/or the power supply wiring. A ground through-hole 100a is arranged adjacently to the signal and/or the power supply through-hole 99a, and a ground through-hole 100b is arranged adjacently to the signal and/or the power supply through-hole 99b, thus connecting to respective ground wiring 96, ground wiring 97, and ground wiring 98.

When the current flows through the signal and/or the power supply through-hole 99*a* from the signal wiring 86 or the power supply wiring 87, through the signal wiring 90 or the power supply wiring 91, through the signal and/or power supply through-hole 99*b*, and through the signal wiring 92 or the power supply wiring 93, the return circuit current is induced in the ground wiring 96 with respect to the signal wiring 86 or the power supply wiring 87, in the ground through-hole 100*a* with respect to the signal and/or the power supply through-hole 99*a*, in the ground wiring 97 with respect to the signal wiring 90 or the power supply wiring 91, in the ground through-hole 100*b* with respect to the signal and/or the power supply through-hole 99*b*, and in the ground wiring 98 with respect to the signal wiring 92 or the power supply wiring 93, then also being secured the return circuit current route continuously. As a result, the loop which is made by the current becomes small, the needless radiation of the electro-magnetic wave is suppressed.

As is clear from the above-described embodiments, the multilayer printed circuit board according to the present invention is provided with at least two ground layers in which at least one of wiring layers constituting advance circuit current route of the signal and/or the power supply is arranged adjacently thereto. According to the present configuration, the return circuit current route of the signal and the power supply toward the ground layer is secured. The return circuit current to the ground layer is induced. As a result, the loop made by the current becomes small, thus it becomes possible to suppress needless radiation of the electro-magnetic wave.

While preferred embodiments of the invention have been described using specific terms, such description is for illustrative purpose only, and it is to be understood that changes and variations may be made without departing from the spirit or scope of the following claims.

What is claimed is:

1. A multilayer printed circuit board comprising:

at least two wiring layers each having a combination of a signal wiring and a power supply wiring electrically separated by an insulation material, the combination forming an advance circuit current route of a signal and a power supply;

at least two ground layers, each arranged adjacent to one of the two wiring layers to form a return circuit current route of the signal and the power supply;

a first through-hole for connecting said signal wiring and said power supply wiring in said at least two wiring layers;

a second through-hole for connecting at least two of said ground layers with each other, said second through-hole being adjacent said first through-hole, thus securing a continuous return circuit current route with respect to said advance circuit current route of said at least two wiring layers; and at least one insulation layer arranged between said at least two wiring layers, wherein insulation material is provided between each of said wiring layers and the ground layer adjacent thereto.

2. A multilayer printed circuit board as claimed in claim 1, wherein the at least one insulation layer arranged between said at least two wiring layers is also arranged between said at least two ground layers.

3. The multilayer printed circuit board as claimed in claim 1, wherein the at least two ground layers are electrically coupled by at least one through-hole in addition to said second through-hole.

* * * * *